US008258539B2

(12) United States Patent
Hwang et al.

(10) Patent No.: US 8,258,539 B2
(45) Date of Patent: Sep. 4, 2012

(54) NITRIDE SEMICONDUCTOR LIGHT EMITTING DEVICE

(75) Inventors: Seok Min Hwang, Kyungki-do (KR);
Hyun Kyung Kim, Kyungki-do (KR);
Kun Yoo Ko, Kyungki-do (KR); Sang Su Hong, Kyungki-do (KR); Kyu Han Lee, Kyungki-do (KR); Bok Ki Min, Kyungki-do (KR)

(73) Assignee: Samsung LED Co., Ltd., Gyunggi-Do (KR)

( * ) Notice: Subject to any disclaimer, the term of this patent is extended or adjusted under 35 U.S.C. 154(b) by 0 days.

(21) Appl. No.: 12/838,031

(22) Filed: Jul. 16, 2010

(65) Prior Publication Data
US 2010/0276725 A1 Nov. 4, 2010

Related U.S. Application Data

(63) Continuation of application No. 11/499,727, filed on Aug. 7, 2006, now Pat. No. 7,777,245.

(30) Foreign Application Priority Data

Aug. 9, 2005 (KR) .................. 10-2005-0072963

(51) Int. Cl.
*H01L 33/00* (2010.01)
(52) U.S. Cl. ................... 257/99; 257/E33.065
(58) Field of Classification Search .......... 257/99, 257/81, 773, E33.062, E33.065
See application file for complete search history.

(56) References Cited

U.S. PATENT DOCUMENTS

| 4,864,370 | A | 9/1989 | Gaw et al. |
| 6,307,218 | B1 | 10/2001 | Steigerwald et al. |
| 6,650,018 | B1 | 11/2003 | Zhao et al. |
| 6,858,873 | B2 | 2/2005 | Lee |
| 7,193,245 | B2 | 3/2007 | Zhao et al. |
| 7,777,245 | B2 * | 8/2010 | Hwang et al. ............... 257/99 |

(Continued)

FOREIGN PATENT DOCUMENTS

JP 10-321912 12/1998

(Continued)

OTHER PUBLICATIONS

Japanese Office Action issued in Japanese Patent Application No. JP 2006-216783 dated Sep. 8, 2009.

(Continued)

*Primary Examiner* — Mark Prenty
(74) *Attorney, Agent, or Firm* — McDermott Will & Emery LLP

(57) ABSTRACT

The invention relates to a high-output nitride light emitting device. The light emitting device includes a first conductivity type nitride semiconductor layer, an active layer and a second conductivity type nitride semiconductor layer deposited in their order on a substrate. The light emitting device also includes first and second insulation layers formed in different upper surface portions of the nitride semiconductor light emitting device, and first and second bonding pads formed respectively on the first and second insulation layers. The light emitting device further includes first and second extension electrodes extended from the first and second bonding pads and coupled respectively to the first and second conductivity semiconductor layers. The electrode arrangement according to the present invention prevents direct coupling between the bonding pads and the light emitting device, thus allowing a symmetrical structure that can achieve more uniform current spreading using only the extension electrodes.

10 Claims, 7 Drawing Sheets

U.S. PATENT DOCUMENTS

| | | |
|---|---|---|
| 2003/0107053 A1 | 6/2003 | Uemura et al. |
| 2003/0136965 A1 | 7/2003 | Lee |
| 2004/0232454 A1 | 11/2004 | Uemura et al. |

FOREIGN PATENT DOCUMENTS

| | | |
|---|---|---|
| JP | 11-040854 | 2/1999 |
| JP | 2000-022210 | 1/2000 |
| JP | 2000-164930 | 6/2000 |
| JP | 2001-077419 | 3/2001 |
| JP | 2001-111103 | 4/2001 |
| JP | 2001-345480 | 12/2001 |
| JP | 2003-524295 | 8/2003 |
| JP | 2004-281581 | 10/2004 |
| WO | WO 01/41223 A1 | 6/2001 |

OTHER PUBLICATIONS

Chinese Office Action, with English translation thereof, issued in Chinese Patent Application No. CN 2006101097601, dated Sep. 4, 2009.

Japanese Office Action, w/ English translation thereof, issued in Japanese Patent Application No. JP 2006-216783 dated Aug. 17, 2010.

* cited by examiner (a)

(b)

NITRIDE SEMICONDUCTOR LIGHT EMITTING DEVICE

CLAIM OF PRIORITY

This application is a Continuation of U.S. patent application Ser. No. 11/499,727, filed on Aug. 7, 2006, and now U.S. Pat. No. 7,777,245, claiming priority of Korean Patent Application No. 10-2005-0072963, filed on Aug. 9, 2005, the entire contents of each of which are hereby incorporated by reference.

BACKGROUND OF THE INVENTION

1. Field of the Invention

The present invention relates to a nitride semiconductor light emitting device, and more particularly, to a nitride semiconductor light emitting device having an electrode structure that facilitates uniform current spreading.

2. Description of the Related Art

In general, a nitride semiconductor is a group III-V semiconductor crystal such as GaN, InN and AlN, and especially used widely as a light emitting device capable of generating a single wavelength light (ultraviolet rays or green light), and particularly, blue light. Such a nitride light emitting device is manufactured using an insulation substrate such as a sapphire substrate or a SiC substrate that satisfies lattice matching conditions for crystal growth. Thus, the nitride light emitting device typically has a planar structure in which two electrodes connected respectively to p- and n-nitride semiconductor layers are disposed substantially horizontally on an upper surface of a light emitting structure.

In comparison with a vertical-structure light emitting device in which two electrodes are respectively disposed on upper and lower surfaces of a light emitting structure, such a planar-structure nitride light emitting device cannot uniformly spread current in the entire light emission area thereof, thus having a not-so-large effective area for light emission and low light emission efficiency per light emission area. Such a problem of non-uniform current spreading is more serious in a larger light emitting device for illumination purpose which requires high output.

As a solution for the problem of current spreading, the electrode structure is extended in the entire area of the device as in the case of a nitride semiconductor light emitting device shown in FIGS. 1(a) and 1(b).

Referring to FIG. 1(a) together with FIG. 1(b), there is shown a nitride semiconductor light emitting device 10 in which a first conductivity type nitride semiconductor layer 12, an active layer 14 and a second conductivity type nitride semiconductor layer 15 are deposited in their order on a substrate 11. A transparent electrode layer 16 may additionally be formed on the second conductivity type nitride semiconductor layer 15 for an ohmic contact.

A portion of an upper surface of the nitride semiconductor light emitting device, where a first electrode is to be formed and connected to the first conducting nitride semiconductor device, is mesa-etched to expose a corresponding portion of an upper surface of the first conductivity type nitride semiconductor layer. Thus, the first and second electrodes 18 and 19 are formed respectively on the exposed portion of the first conductivity type nitride semiconductor layer and the exposed portion of the second conductivity type nitride semiconductor layer (More specifically, the transparent electrode layer 16).

The first electrode 18 is composed of a first bonding pad 18a and first extension electrodes 18b extended from the first bonding pad 18a, whereas the second electrode 19 is composed of a second bonding pad 19a and a second extension electrode 19b extended from the second bonding pad 19a. As shown in FIG. 1a, the first and second bonding pads 18a and 19a are disposed at opposing ends of the device 10, respectively. The first extension electrodes 18b are extended along opposing longitudinal sides, toward the second bonding pad 19a. The second extension electrode 19b is extended along a center of the device 10 such that the first extension electrodes 18b are positioned at the opposing sides about the second extension electrode 19b at a predetermined interval. Thereby, the first and second electrodes 18 and 19 can be disposed in a relatively regulated interval using the first and second extension electrodes 18b and 19b.

However, as the first and second bonding pads 18a and 19a are formed in relatively large areas for wire bonding, it is almost impossible to form the first and second electrodes 18 and 19 at a perfectly regulated interval. For example, as shown in FIG. 1, even if the first and second extension electrodes 18b and 19b are disposed at a predetermined interval d1 from each other, since the second bonding pad 19a has relatively a large area, the interval d2 between the second bonding pad 19a and an adjacent portion of the first extension electrode 18b is narrower. In general, current flow tends to be concentrated in a region of small resistance, and thus even if the interval is regulated using the extension electrodes, the current is concentrated in a region adjacent to the large bonding pad, thus hindering uniform current spreading.

Such a problem is more serious in a large light emitting device such as an LED for illumination purpose. And as stated above, it is hard to expect increased light emission efficiency with increased area of the device.

SUMMARY OF THE INVENTION

The present invention has been made to solve the foregoing problems of the prior art and therefore an object of certain embodiments of the present invention is to provide a nitride semiconductor device which insulates bonding pad regions from a light emitting structure and uses electrodes extended from the bonding pads to thereby allow uniform current spreading.

According to an aspect of the invention for realizing the object, there is provided a nitride semiconductor light emitting device, which includes a first conductivity type nitride semiconductor layer, an active, layer and a second conductivity semiconductor layer deposited in their order on a substrate, including: a first insulation layer and a second insulation layer formed on different portions of an upper surface of the nitride light semiconductor emitting device; a first bonding pad formed on the first insulation layer; a second bonding pad formed on the second insulation layer; a first extension electrode extended from the first bonding pad and connected to the first conductivity semiconductor layer; and a second extension electrode extended from the second bonding pad and connected to the second conductivity semiconductor layer.

Preferably, the first and second extension electrodes are disposed in parallel with and in a predetermined interval from each other. In this case, the first and second extension electrodes may be disposed respectively on portions adjacent to opposing sides of the light emitting device. Alternatively, the first and second extension electrodes may be provided in a plural number, and disposed alternately in parallel with each other. Specifically, one of the first and second extension electrodes may be provided in a pair, and the pair of extension electrodes may be disposed in parallel with each other at opposing sides about the remaining one extension electrode.

The first and second insulation layers which define formation areas of the first and second bonding pads, can be formed at various locations. For example, the first and second insulation layers may be formed on upper surface portions of the first conductivity type nitride semiconductor layer exposed by removing corresponding portions of the second conductivity type nitride semiconductor layer and the active layer. Alternatively, one of the first and second insulation layers may be formed on an upper surface portion of the first conductivity type nitride semiconductor layer exposed by removing a corresponding portion of the second conductivity type nitride semiconductor layer and the active layer, and the other one of the first and second insulation layers is formed on an upper surface portion of the second conductivity type nitride semiconductor layer. Further, both the first and second insulation layers may be formed on upper surface portions of the second conductivity type nitride semiconductor layer.

Preferably, the first and second insulation layers are formed symmetrically about a center of an upper surface of the semiconductor light emitting device, thereby easily disposing the first and second extension electrodes extended from the first and second bonding pads in a symmetrical structure with a predetermined interval therebetween.

In this case, the first and second insulation layers may be formed on portions adjacent to a pair of opposing sides of the semiconductor light emitting device, thereby advantageously ensuring a sufficient effective light emission area. Preferably, the first and second extension electrodes are extended in parallel with and in a predetermined interval from each other.

In addition, at least one of the first and second extension electrodes may be terminated with a portion opposed, in a thickness direction of the light emitting device, to a bonding pad of different polarity, and the other one of the extension electrodes may be extended from a portion adjoining the bonding pad of different polarity.

In an embodiment of the present invention, the nitride semiconductor light emitting device comprises a parallelepiped structure. In this structure, the pair of opposing sides, which the first and second insulation layers are formed adjacent to, may have a length shorter than that of a second pair of opposing sides. In this case, it is preferable that the first and second extension electrodes are formed respectively along the second pair of opposing sides.

In another embodiment of the present invention, the nitride semiconductor light emitting device comprises a parallelepiped structure. In this structure, the pair of opposing sides, which the first and second insulation layers are formed adjacent to, may have a length longer than that of a second pair of opposing sides. In this case, both the first and second insulation layers may be formed in a central portion of the second pair of opposing sides.

Also in this embodiment of the present invention, it is preferable that the first and second extension electrodes are extended along the pair of opposing sides which the first and second insulation layers are formed adjacent to. In this case, each of the first and second extension electrodes may include two extension parts extended in opposite directions along the pair of opposing sides which the first and second insulation layers are formed adjacent to.

Preferably, the nitride semiconductor light emitting device according to the present invention may further include a transparent electrode layer formed on the second conductivity type nitride semiconductor layer, thereby further enhancing uniform current spreading effects in the entire area of the device.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENT

Preferred embodiments of the present invention will now be described in detail with reference to the accompanying drawings.

Figure 1:
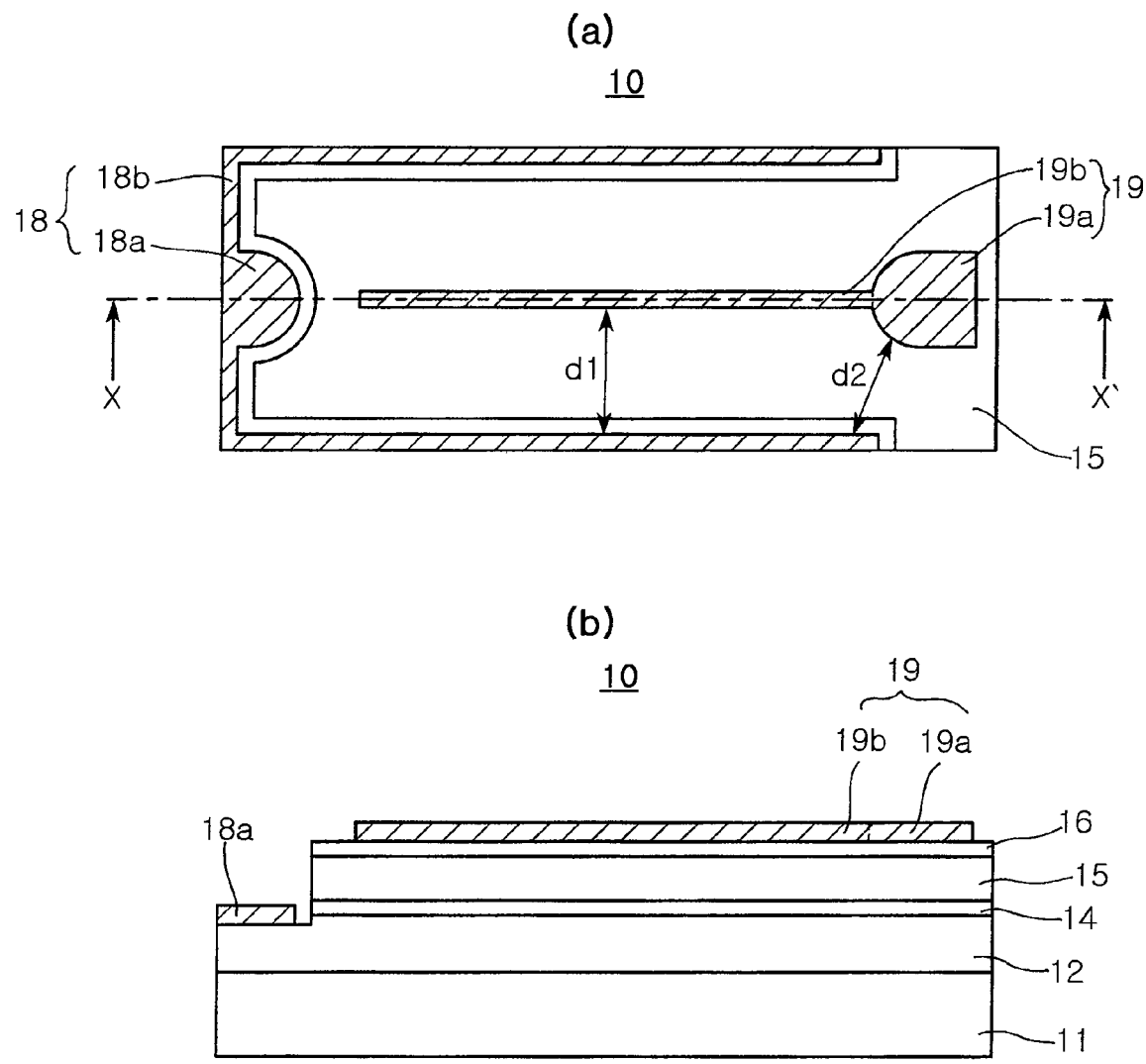
FIG. 1 illustrates a conventional nitride semiconductor light emitting device in which (a) is a plan view of an upper part thereof and (b) is a side sectional view.
Figure 2:
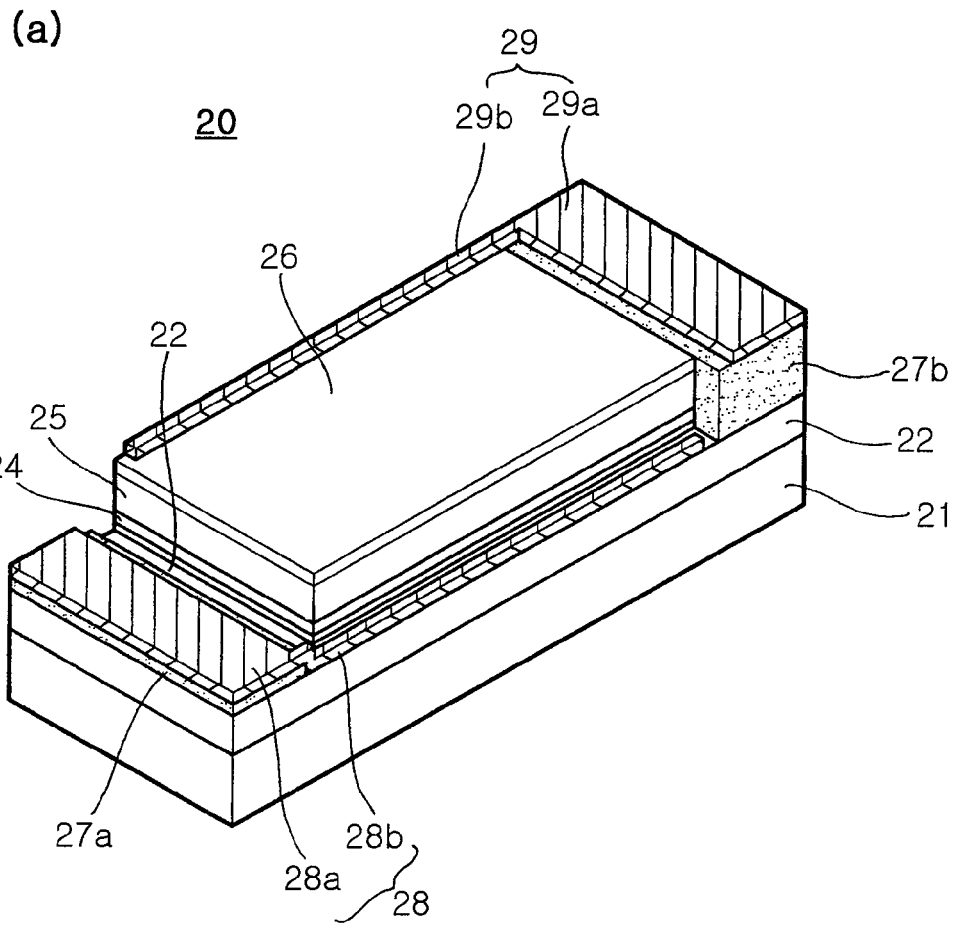
FIG. 2 illustrates a nitride semiconductor light emitting device according to the present invention in which (a) is a perspective view and (b) is a plan view of an upper part thereof.
Figure 2:
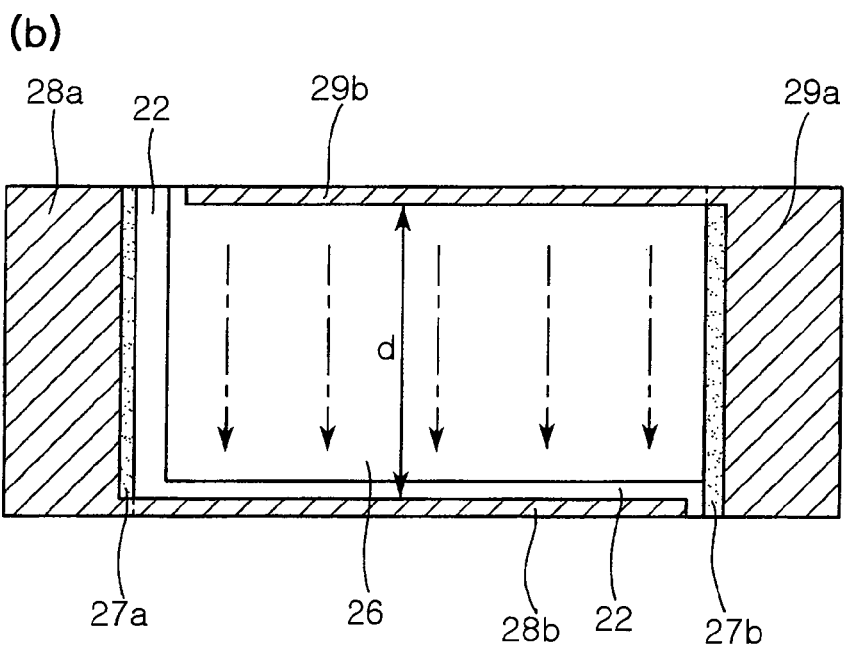

FIG. 2 illustrates a nitride semiconductor light emitting device according to an embodiment of the present invention in which (a) is a perspective view and (b) is a plan view of an upper part thereof.

Referring to FIG. 2(a), the parallepiped nitride semiconductor light emitting device 20 includes a first conductivity type nitride semiconductor layer 22, an active layer 24, a second conductivity type nitride semiconductor layer 25 deposited in their order on a substrate 21.

A transparent electrode layer 26 may additionally be formed on the second conductivity type nitride semiconductor layer 25 for an ohmic contact. The transparent electrode layer 26 may be made of a material such as Indium Tin Oxide (ITO), and may additionally enhance current spreading effects by providing a predetermined surface resistance in the entire light emission area of the device.

In this embodiment, a portion excluding the light emission area is mesa-etched to expose a corresponding portion of an upper surface of the first conductivity type nitride semiconductor layer 22. First and second insulation layers 27a and 27b are provided at opposing ends of the exposed first conductivity type nitride semiconductor layer 22, respectively. And first and second bonding pads 28a and 29a are formed on the first and second insulation layers 27a and 27b, respectively. The first and second extension electrodes 28b and 29b are extended respectively from the first and second bonding pads 28a and 29a and electrically coupled respectively to the first and second conductivity type nitride semiconductor layers 22 and 25. The second extension electrode 28b, however, is formed directly on the transparent electrode layer 26.

The first and second insulation layers 27a and 27b prevent the first and second bonding pads 28a and 29b from directly coupling to the device 20 so that only the first and second insulation layers 27a and 27b are directly coupled to and provide current to the light emitting device 20. Thus, the problem of current concentration in the vicinity of the bonding pads 28a and 29a is mitigated, ensuring uniform current flow by the arrangement of the first and second extension electrodes 28b and 29b.

In the parallelepiped light emitting structure shown in FIG. 2(b), the first and second bonding pads 28a and 29a are disposed respectively at opposing ends of the device 20. And the first and second extension electrodes 28b and 29b are extended from the first and second bonding pads 28a and 29a along opposing sides in a longitudinal direction. In addition, the first and second extension electrodes 28b and 29b are disposed in parallel with each other at a predetermined interval d. In these electrode structures 28 and 29, the electrode region directly coupled to the device 20 is limited to the first and second extension electrodes 28b and 29b, thus realizing an exact symmetrical structure that ensures more uniform current flow.

This embodiment is exemplified by a parallelpiped light emitting device but the present invention may also be applied to various structures of light emitting devices. Even a polygon-shaped light emitting structure can be adopted to design an electrode structure in which the bonding pad regions are prevented from directly coupling to the device by the insulation layers and only the extension electrodes are used to effectively ensure current spreading.

In addition, this embodiment is exemplified by forming the bonding pads on mesa-etched surfaces, which however does not limit the present invention. As the bonding pads of the first and second electrodes are formed on the insulation layers, the bonding pads are not limited to be formed on the mesa-etched surfaces but can be formed on other regions. The bonding pad structures can be variously formed as illustrated in FIGS. 3(a) and (b).

Figure 3:
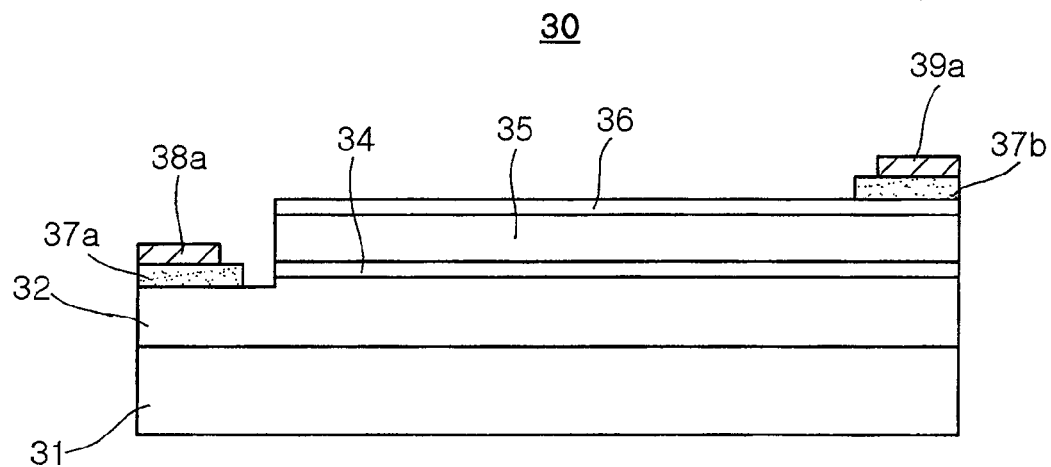
FIG. 3(a) is a side sectional view illustrating a nitride semiconductor light emitting device according to another embodiment of the present invention.
FIG. 3(b) is a side sectional view illustrating a nitride semiconductor light emitting device according to yet another embodiment of the present invention.
Figure 3:
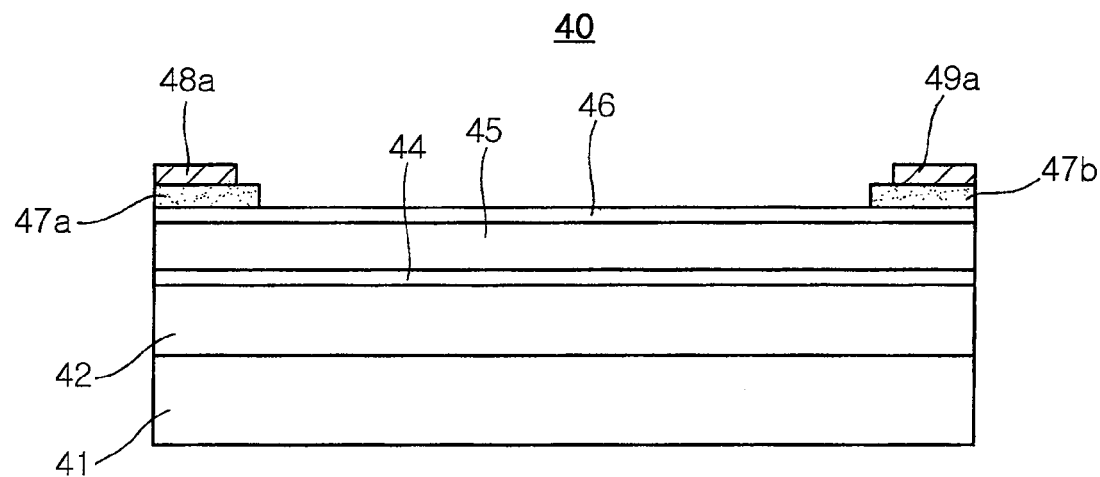

The nitride light emitting device 30 shown in FIG. 3(a) includes a first conductivity type nitride semiconductor layer 32, an active layer 34 and a second conductivity type nitride semiconductor layer 35 formed in their order on a substrate 31, and a transparent electrode layer 36 formed on the second nitride semiconductor layer 35.

In this embodiment, a first insulation layer 37a is formed on an upper surface region of an exposed portion of the first conductivity type nitride semiconductor layer 32, and the second insulation layer 37b is directly formed on the transparent electrode layer 36. First and second bonding pads 38a and 39a are formed respectively on the first and second insulation layers 37a and 37b.

In this structure, the first and second extension electrodes (not shown) extended respectively from the first and second bonding pads 38a and 39b have to be coupled respectively to the first and second conductivity type nitride semiconductor layers 32 and 35 (The second extension electrode is actually coupled to the transparent electrode layer 36 in this embodiment). Therefore, the first and second extension electrodes (not shown) can be advantageously formed without a big height difference from the first and second bonding pads 38a and 39a.

The nitride light emitting device 40 shown in FIG. 3(b) includes a first conductivity type nitride semiconductor layer 42, an active layer 44 and a second conductivity type nitride semiconductor layer 45 formed in their order on a substrate 41, and a transparent electrode layer 45 formed on the second conductivity nitride layer 45.

In this embodiment, first and second insulation layers 47a and 47b are directly formed on the transparent electrode layer 46 which is not mesa-etched. And first and second bonding pads 48a and 49a are formed respectively on the first and second insulation layers 47a and 47b. Typically, the first electrode structure, which is to be coupled to the first conductivity type nitride semiconductor layer 42, is formed on an exposed portion of first conductivity type nitride semiconductor layer 42. However, as the bonding pads 48a and 49a adopted in the invention are formed on the insulation layers 47a and 47b, and not directly coupled to the device 40 via surface contact, both of the two bonding pads 48a and 49b can be disposed on the transparent electrode layer 46. When there is no transparent electrode layer, they can be formed on the second conductivity nitride layer 45.

Still in this structure, the first extension electrode (not shown) extended from the first bonding pad 48a should be coupled to the first conductivity type nitride semiconductor layer 42. Thus, a portion of the device where the first extension electrode is to be formed needs to be mesa-etched as shown in FIG. 2(a).

Figure 4:
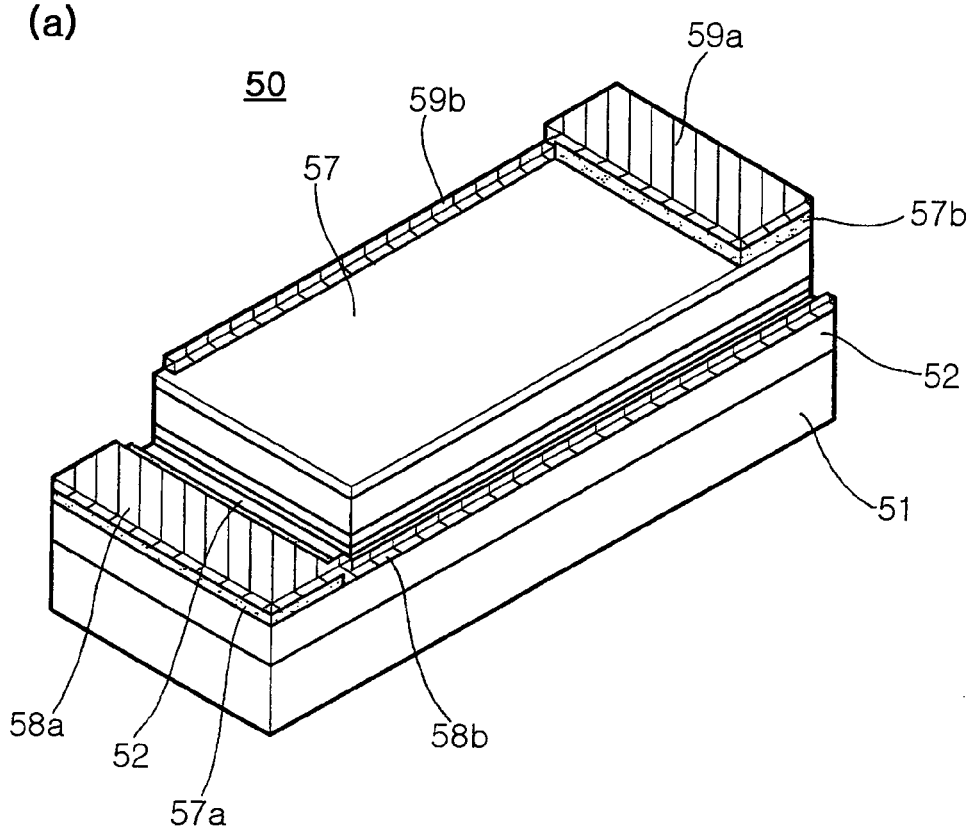
FIG. 4 illustrates a nitride semiconductor light emitting device according to further another embodiment of the present invention in which (a) is a perspective view and (b) is a plan view of an upper part thereof.
Figure 4:
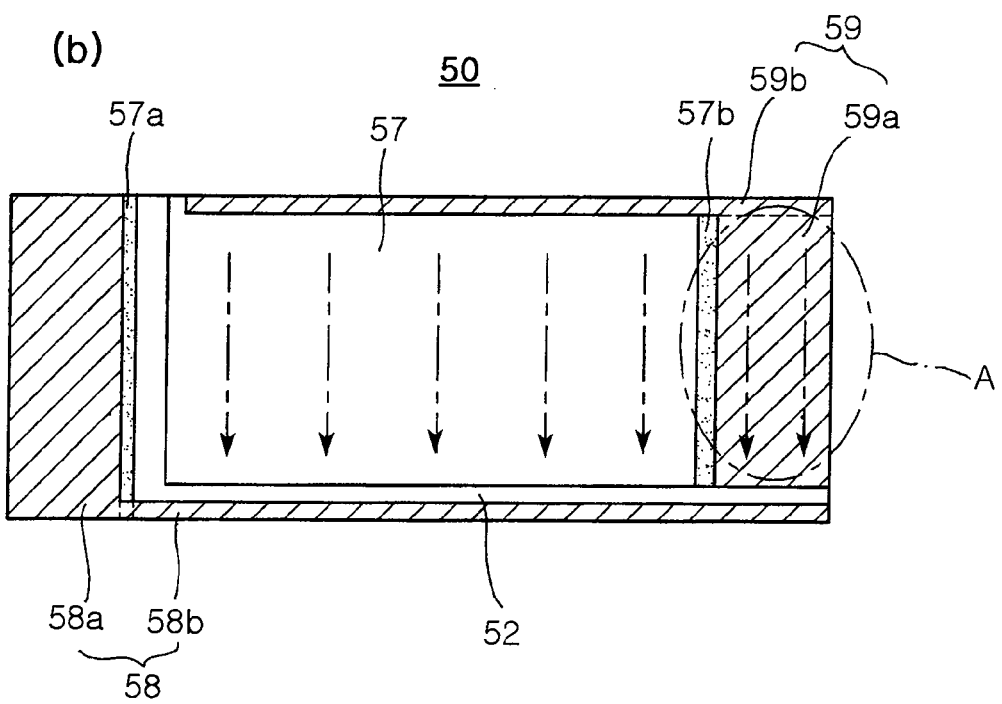

FIG. 4 illustrates a nitride semiconductor light emitting device according to another embodiment, in which (a) is a perspective view and (b) is a plan view of an upper part thereof. In this embodiment, the structure is improved such that an effective light emission area also includes a region of the device where the second bonding pad 59a is formed.

Referring to FIG. 4(a), the parallelpiped nitride semiconductor light emitting device 50 includes a first conductivity type nitride semiconductor layer 52, an active layer 54 and a second conductivity type nitride semiconductor layer 55 deposited in their order on a substrate 51, similar to the device shown in FIG. 2(a). In addition, a transparent electrode layer 57 may be additionally formed on the second conductivity type nitride semiconductor layer 55 for an ohmic contact.

In this embodiment, only a portion where the first bonding pad 58a and the first extension electrode 58b are to be formed is selectively mesa-etched to expose a corresponding portion of an upper surface of the first conductivity type nitride semiconductor layer 52. The first and second insulation layers 57a and 57b are provided on the exposed end portion of the first conductivity type nitride semiconductor layer 52 and on an end portion of the transparent electrode layer 56.

First and second bonding pads 58a and 59a are formed respectively on the first and second insulation layers 57a and 57b. The first and second extension electrodes 58b and 59b are extended respectively from the first and second bonding pads 58a and 59a, and electrically coupled respectively to the first and second conductivity type nitride semiconductor layers 52 and 55. (The second extension electrode 59b, however, is formed directly on the transparent electrode layer 56.)

In this embodiment, as shown in FIG. 4(b), the first and second extension electrodes 58b and 59b are extended along opposing sides in a longitudinal direction. In particular, the first extension electrode 58b is terminated with a portion thereof opposed, in a thickness direction of the light emitting device, to the second bonding pad 59a. In addition, the second extension electrode 59b is extended from a side portion of the device which adjoins the second bonding pad 59a and is opposed to the terminated portion of the first extension electrode 58b.

With this arrangement of the extension electrodes, uniform current is ensured even in the active layer region A located underneath the second bonding pad 59a, thus increasing a substantial effective light emission area. The second insulation layer 57b and the second bonding pad 59a can be formed in a limited size to facilitate light extraction from the extended active layer region A underneath the second bonding pad 59a.

Figure 5:
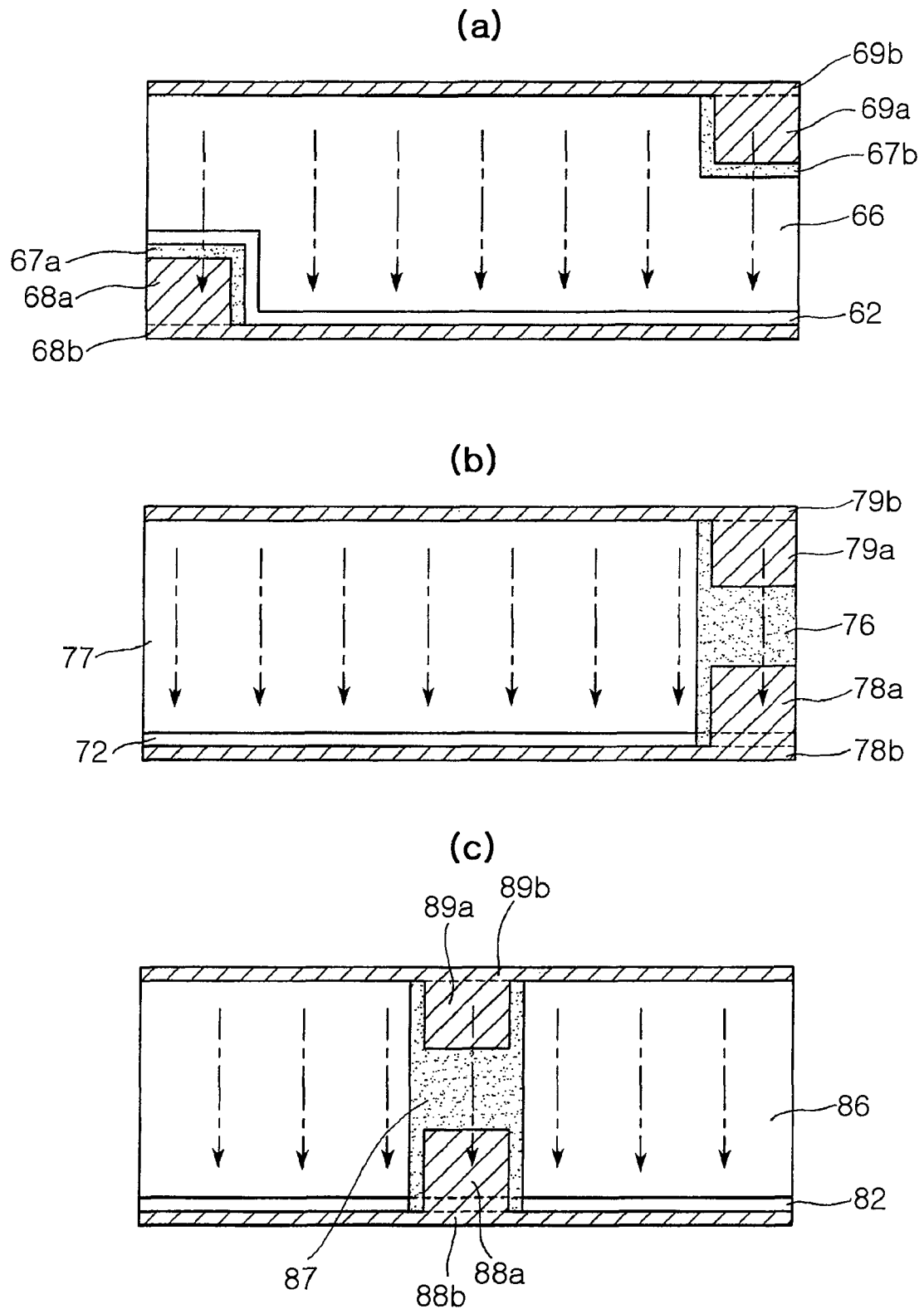
FIGS. 5(a) to 5(c) are plan views of upper parts of nitride semiconductor light emitting devices according to further other embodiments of the present invention.

As described above, the locations of the insulation layers and the bonding pads according to the present invention can be varied. FIGS. 5(a) to 5(c) are plan views of upper parts of nitride semiconductor light emitting devices according to various embodiments of the invention.

First, as shown in FIG. 5(a), the bonding pads can be formed on the first and second insulation layers 67a and 67b, symmetrically from each other about a center of the light emitting device 60. In particular, the bonding pads can be formed in corner regions to obtain a relatively larger overall light emission area defined by the active layer (not shown). The first and second bonding pads 68a and 69a are formed on the first and second insulation layers 67a and 67b.

The first and second extension electrode 68b and 69b are extended from corners opposing each other about the center. The first extension electrode 68b is terminated with a portion thereof opposed, in a thickness direction of the device, to the second bonding pad 69a. The second extension electrode 69b is terminated with a portion thereof opposed, in a thickness direction of the device, to the first bonding pad 68a. This ensures uniform light emission in the entire area of the device.

In the embodiment shown in FIG. 5(a), the first and second bonding pads can be disposed sufficiently apart from each other, which can advantageously facilitate a wire bonding process. In this embodiment, however, the locations of the bonding pads are not a critical factor for consideration to obtain uniform current spreading, and thus can be changed freely.

FIG. 5(b) is a structure in which both the first and second bonding pads 78a and 79a are formed at one end of the light emitting device 70. In order for this, the insulation layer 76 is formed at the one end, and since unlike other embodiment, the first and second bonding pads 78a and 79a are provided adjacent to each other, the insulation layer 76 may be provided as a single one but may also be provided as two separate ones.

In addition, a portion of the device where the first extension electrode 78b is to be formed is mesa-etched to expose a portion of an upper surface of the first conductivity type nitride semiconductor layer 72. The first and second extension electrodes 78b and 79b are extended along opposing longitudinal sides adjoining the bonding pads, to the sides of the first and second bonding pads 78a and 79a, effectively increasing an overall light emission area.

FIG. 5(c) presents a structure in which the first and second bonding pads 88a and 89a are disposed in a central portion of opposing longitudinal sides of the light emitting device 80. In order for this, the insulation layer 87 is formed at a central portion of the device, and similar to aforedescribed embodiment, the first and second bonding pads 88a and 89a can be provided adjacent to each other. In this embodiment, in case of a parallelepiped structure of the device, it is preferable that the bonding pads (insulation layers) are located at a relatively longer pair of sides.

In addition, a portion where the first extension electrode 88b is to be formed is mesa-etched to expose a corresponding portion of an upper surface of the first conductivity type nitride semiconductor layer 82. The first and second extension electrodes 88b and 89b are extended along a pair of the sides adjoining the bonding pads 88a and 89a, effectively increasing an overall light emission area. Alternatively, each of the first and second extension electrodes 88b and 89b may be composed of two extension parts extended respectively from the first and second bonding pads 88a and 89a in opposite directions.

The invention in the above described embodiments is exemplified by electrode structures each having one extension electrode, but may also include a structure in which the first or second extension electrode includes a plurality of extension electrodes.

Figure 6:
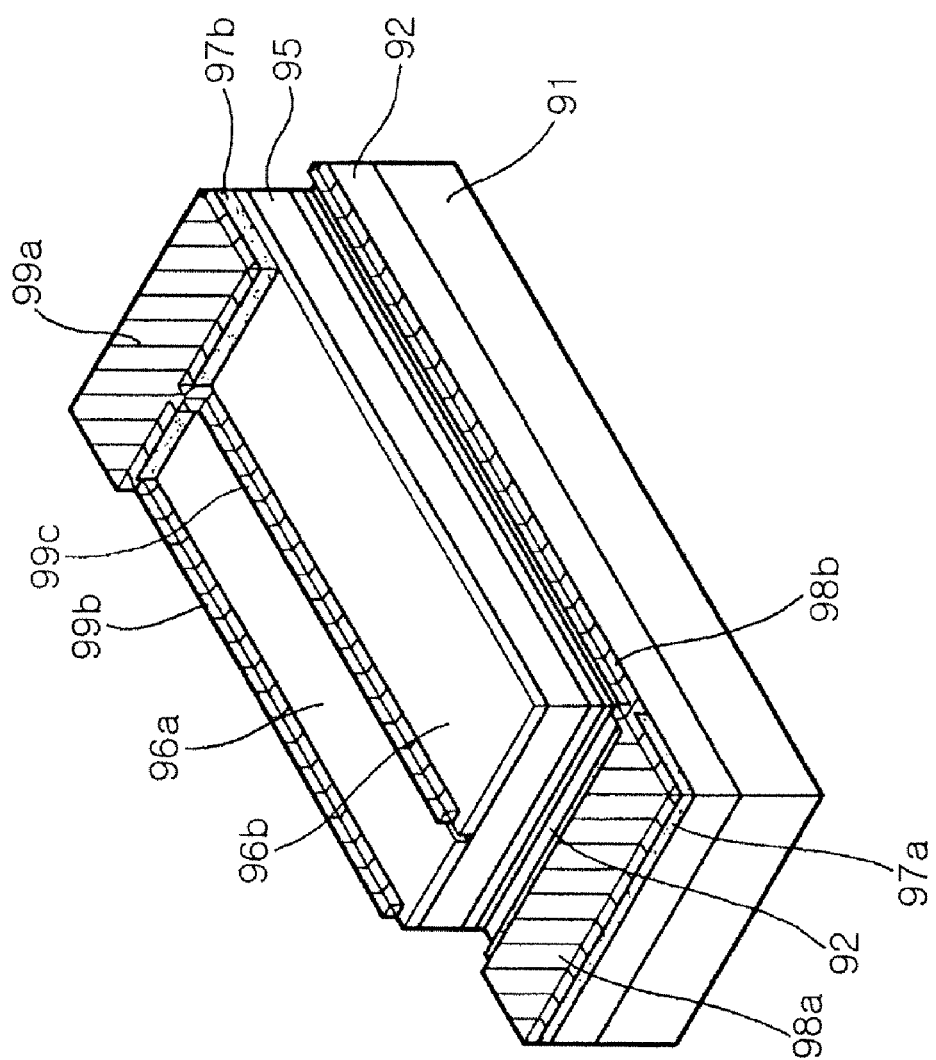
FIG. 6 is a perspective view illustrating an upper part of a nitride semiconductor light emitting device according to further another embodiment of the present invention.

FIG. 6 illustrates a first conductivity type nitride semiconductor layer 92, an active layer 94 and a second conductivity type nitride semiconductor layer 95 are deposited in their order on a substrate 91, similar to the device in FIG. 4(a). First and second transparent electrode layers 96a and 96b may additionally be formed on the second conductivity type nitride semiconductor layer 95 for an ohmic contact. The transparent electrode layers 96a and 96b adopted in this embodiment is dichotomized along the direction in which the pair of second extension electrodes is extended.

In this embodiment, portions where the first bonding pad 98a and the first extension electrode 98b are to be formed are selectively mesa-etched to expose corresponding upper surface portions of the first conductivity type nitride semiconductor layer 92. The first and second insulation layers 97a and 97b are provided respectively on the exposed portion of the first conductivity type nitride semiconductor layer 92 and on the first and second transparent electrode layers 96a and 96b.

The first and second bonding pads 98a and 99a are formed on the first and second insulation layers 97a and 97b. The first extension electrode 98b and the pair of second extension electrodes 99b and 99c are extended respectively from the first and second bonding pads 98a and 99a and electrically connected respectively to the first and second conductivity type nitride semiconductor layers 92 and 95. In this embodiment, each of the pair of second extension electrodes 99b and 99c is respectively formed along a side of each of the transparent electrode layers 96a and 96b. It is of course preferable that each of the pair of second extension electrodes 99b and 99c is formed in a position in each of the transparent electrode layer regions 96a and 96b that is farthest apart from the first extension electrode 98b.

As shown in FIG. 6, the pair of second extension electrodes 99b and 99c are provided in parallel with the first extension electrode 98b, effectively utilizing an overall area of a light emission part. Particularly, in a case where the transparent electrode layer regions 96a and 96b having a similar resistance as a nitride are divided by the pair of second extension electrodes 99b and 99c, more uniform light emission effects are expected from the entire area of the device.

The electrode structure according to the present invention may adopt a structure similar to a comb with a plurality of first and second extension electrodes. As described in previous embodiments, the bonding pads are not directly coupled to the light emitting structure using the insulation layers, and the first and second extension electrodes are disposed in parallel with each other to achieve uniform current spreading.

Figure 7:
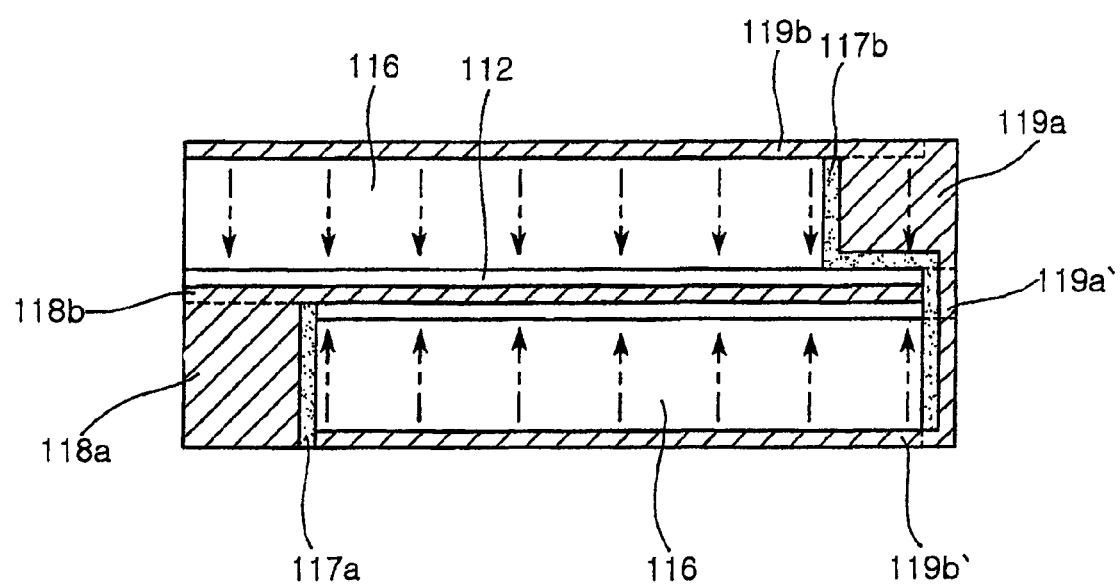
FIG. 7 is a plan view illustrating a nitride semiconductor light emitting device according to further another embodiment of the present invention.

As an example, FIG. 7 illustrates a light emitting device in which a pair of second extension electrodes is provided while there is a first extension electrode provided singly.

As shown in FIG. 7, a pair of second extension electrodes 119b and 119b' is disposed at a pair of longitudinal sides opposed about the one first extension electrode 118b. Each of the second extension electrodes 119b and 119b' is disposed in parallel with and at the same interval from the first extension electrode 118b to ensure uniform current spreading. Each of the extension electrodes 118b, 119b and 119b' is extended from the first and second bonding pads 118a and 119a formed at opposing corners. The bonding pads 118a and 119a are prevented from direct coupling to the device 110 by the first and second insulation layers 117a and 117b. Therefore, only the first and second extension electrodes 118b, 119b and 119b' disposed substantially symmetrically, are directly coupled to the first conductivity type nitride semiconductor layer 112 and the transparent electrode layer 116, thus achieving uniform current spreading in the entire light emission part.

According to the present invention set forth above, insulation layers are provided in advance on locations where bonding pads are to be formed, thereby preventing direct coupling between the bonding pads and a light emitting device. Thus, only extension electrodes are used, without the assistance by the large bonding pads, to easily ensure regulated intervals between the electrodes, thereby achieving more uniform current spreading in an overall area of a light emission part.

While the present invention has been shown and described in connection with the preferred embodiments, it will be apparent to those skilled in the art that modifications and variations can be made without departing from the spirit and scope of the invention as defined by the appended claims.

What is claimed is:

1. A nitride semiconductor light emitting device, which includes a first conductivity type nitride semiconductor layer, an active layer and a second conductivity type nitride semiconductor layer deposited in this order on a substrate, comprising:
    a first insulation layer and a second insulation layer disposed in parallel with each other on opposite sides of an upper surface of the nitride semiconductor light emitting device;
    a first bonding pad disposed on the first insulation layer;
    a second bonding pad disposed on the second insulation layer;
    a first extension electrode extending from the first bonding pad in a direction to the second insulation layer and connected to the first conductivity semiconductor layer; and
    a second extension electrode extending from the second bonding pad in a direction to the first insulation layer and connected to the second conductivity semiconductor layer,
    wherein the first and second extension electrodes are disposed in parallel with and in a predetermined interval from each other,
    wherein the first and second extension electrodes have the same width.

2. A nitride semiconductor light emitting device, which includes a first conductivity type nitride semiconductor layer, an active layer and a second conductivity type nitride semiconductor layer deposited in this order on a substrate, comprising:
    a first insulation layer and a second insulation layer disposed in parallel with each other on opposite sides of an upper surface of the nitride semiconductor light emitting device;
    a first bonding pad disposed on the first insulation layer;
    a second bonding pad disposed on the second insulation layer;
    a first extension electrode extending from the first bonding pad in a direction to the second insulation layer and connected to the first conductivity semiconductor layer; and
    a second extension electrode extending from the second bonding pad in a direction to the first insulation layer and connected to the second conductivity semiconductor layer,
    wherein the first and second extension electrodes are disposed in parallel with and in a predetermined interval from each other,
    wherein the first and second extension electrodes are disposed respectively on portions adjacent to opposing sides of the light emitting device.

3. A nitride semiconductor light emitting device, which includes a first conductivity type nitride semiconductor layer, an active layer and a second conductivity type nitride semiconductor layer deposited in this order on a substrate, comprising:
    a first insulation layer and a second insulation layer disposed in parallel with each other on opposite sides of an upper surface of the nitride semiconductor light emitting device;
    a first bonding pad disposed on the first insulation layer;
    a second bonding pad disposed on the second insulation layer;
    a first extension electrode extending from the first bonding pad in a direction to the second insulation layer and connected to the first conductivity semiconductor layer; and
    a second extension electrode extending from the second bonding pad in a direction to the first insulation layer and connected to the second conductivity semiconductor layer,
    wherein the first and second extension electrodes are disposed in parallel with and in a predetermined interval from each other,
    wherein the first and second extension electrodes are provided in a plural number, and disposed alternately in parallel with each other.

4. A nitride semiconductor light emitting device, which includes a first conductivity type nitride semiconductor layer, an active layer and a second conductivity type nitride semiconductor layer deposited in this order on a substrate, comprising:
    a first insulation layer and a second insulation layer disposed in parallel with each other on opposite sides of an upper surface of the nitride semiconductor light emitting device;
    a first bonding pad disposed on the first insulation layer;
    a second bonding pad disposed on the second insulation layer;
    a first extension electrode extending from the first bonding pad in a direction to the second insulation layer and connected to the first conductivity semiconductor layer; and
    a second extension electrode extending from the second bonding pad in a direction to the first insulation layer and connected to the second conductivity semiconductor layer,
    wherein the first and second extension electrodes are disposed in parallel with and in a predetermined interval from each other,
    wherein the first and second insulation layers are formed on upper surface portions of the first conductivity type nitride semiconductor layer exposed by removing corresponding portions of the second conductivity type nitride semiconductor layer and the active layer.

5. The nitride semiconductor light emitting device according to claim 1, wherein the first insulation layer is formed on an upper surface portion of the first conductivity type nitride semiconductor layer exposed by removing a corresponding portion of the second conductivity type nitride semiconductor layer and the active layer, and the second insulation layer is formed on an upper surface portion of the second conductivity type nitride semiconductor layer.

6. A nitride semiconductor light emitting device, which includes a first conductivity type nitride semiconductor layer, an active layer and a second conductivity type nitride semiconductor layer deposited in this order on a substrate, comprising:
- a first insulation layer and a second insulation layer disposed in parallel with each other on opposite sides of an upper surface of the nitride semiconductor light emitting device;
- a first bonding pad disposed on the first insulation layer;
- a second bonding pad disposed on the second insulation layer;
- a first extension electrode extending from the first bonding pad in a direction to the second insulation layer and connected to the first conductivity semiconductor layer; and
- a second extension electrode extending from the second bonding pad in a direction to the first insulation layer and connected to the second conductivity semiconductor layer,
- wherein the first and second extension electrodes are disposed in parallel with and in a predetermined interval from each other,
- wherein both the first and second insulation layers are formed on upper surface portions of the second conductivity type nitride semiconductor layer.

7. A nitride semiconductor light emitting device, which includes a first conductivity type nitride semiconductor layer, an active layer and a second conductivity type nitride semiconductor layer deposited in this order on a substrate, comprising:
- a first insulation layer and a second insulation layer disposed in parallel with each other on opposite sides of an upper surface of the nitride semiconductor light emitting device;
- a first bonding pad disposed on the first insulation layer;
- a second bonding pad disposed on the second insulation layer;
- a first extension electrode extending from the first bonding pad in a direction to the second insulation layer and connected to the first conductivity semiconductor layer; and
- a second extension electrode extending from the second bonding pad in a direction to the first insulation layer and connected to the second conductivity semiconductor layer,
- wherein the first and second extension electrodes are disposed in parallel with and in a predetermined interval from each other,
- wherein the first and second insulation layers are formed symmetrically about a center of an upper surface of the semiconductor light emitting device.

8. A nitride semiconductor light emitting device, which includes a first conductivity type nitride semiconductor layer, an active layer and a second conductivity type nitride semiconductor layer deposited in this order on a substrate, comprising:
- a first insulation layer and a second insulation layer disposed in parallel with each other on opposite sides of an upper surface of the nitride semiconductor light emitting device;
- a first bonding pad disposed on the first insulation layer;
- a second bonding pad disposed on the second insulation layer;
- a first extension electrode extending from the first bonding pad in a direction to the second insulation layer and connected to the first conductivity semiconductor layer; and
- a second extension electrode extending from the second bonding pad in a direction to the first insulation layer and connected to the second conductivity semiconductor layer,
- wherein the first and second extension electrodes are disposed in parallel with and in a predetermined interval from each other,
- wherein the first and second insulation layers are formed on portions adjacent to a pair of opposing sides of the semiconductor light emitting device.

9. The nitride semiconductor light emitting device according to claim 1, wherein one of the first and second extension electrodes is provided in a pair, and the pair of extension electrodes are disposed in parallel with each other at an opposing side of the other of the first and second extension electrodes.

10. The nitride semiconductor light emitting device according to claim 1, wherein the upper surface of the first insulation layer is not at a same level with the upper surface of the second insulation layer.

* * * * *